United States Patent
Huang

[11] Patent Number: 6,162,691
[45] Date of Patent: Dec. 19, 2000

[54] METHOD FOR FORMING A MOSFET WITH RAISED SOURCE AND DRAIN, SALICIDING, AND REMOVING UPPER PORTION OF GATE SPACERS IF BRIDGING OCCURS

[75] Inventor: Kuei-Wu Huang, Hsin-Chu, Taiwan

[73] Assignee: Taiwan Semiconductor Manufacturing Company, Hsin-Chu, Taiwan

[21] Appl. No.: 09/282,066

[22] Filed: Mar. 29, 1999

[51] Int. Cl.[7] .................................................. H01L 21/336
[52] U.S. Cl. ........................ 438/300; 438/297; 438/592
[58] Field of Search .................................. 438/296, 297, 438/303, 304, 586, 592

[56] References Cited

U.S. PATENT DOCUMENTS

| | | | |
|---|---|---|---|
| 5,496,750 | 3/1996 | moslehi | 438/297 |
| 5,668,065 | 9/1997 | Lin | 438/303 |
| 5,691,212 | 11/1997 | Tsai et al. | 437/24 |
| 5,736,419 | 4/1998 | Naem | 437/44 |
| 5,780,349 | 7/1998 | Naem | 438/305 |
| 5,804,846 | 9/1998 | Fuller | 257/252 |
| 5,827,768 | 10/1998 | Lin et al. | 438/300 |

*Primary Examiner*—Charles Bowers
*Assistant Examiner*—William M. Brewster
*Attorney, Agent, or Firm*—George O. Saile; Stephen B. Ackerman

[57] ABSTRACT

A method to create raised landing pads for gate electrodes. A layer of polysilicon is deposited over the gate electrode after the gate spacers and the gate isolation areas have been formed. The gate electrode contains two layers, that is a bottom layer of poly and a top layer of oxide or SOG. A layer of photo resist is deposited over the polysilicon, a pattern of landing pads is created in the photo resist. The layer of polysilicon is etched in accordance with the pattern in the photo resist thus forming the elevated landing pads. Source and drain areas of the gate electrode can be contacted by metallic contacts that are in interconnects with these landing pads. The top layer of the gate electrode is removed making the gate electrode a recessed electrode. The invention thereby provides an easy method for removing (by CMP) any bridging that might occur (between the gate electrode and the landing pads) during salicidation.

21 Claims, 2 Drawing Sheets

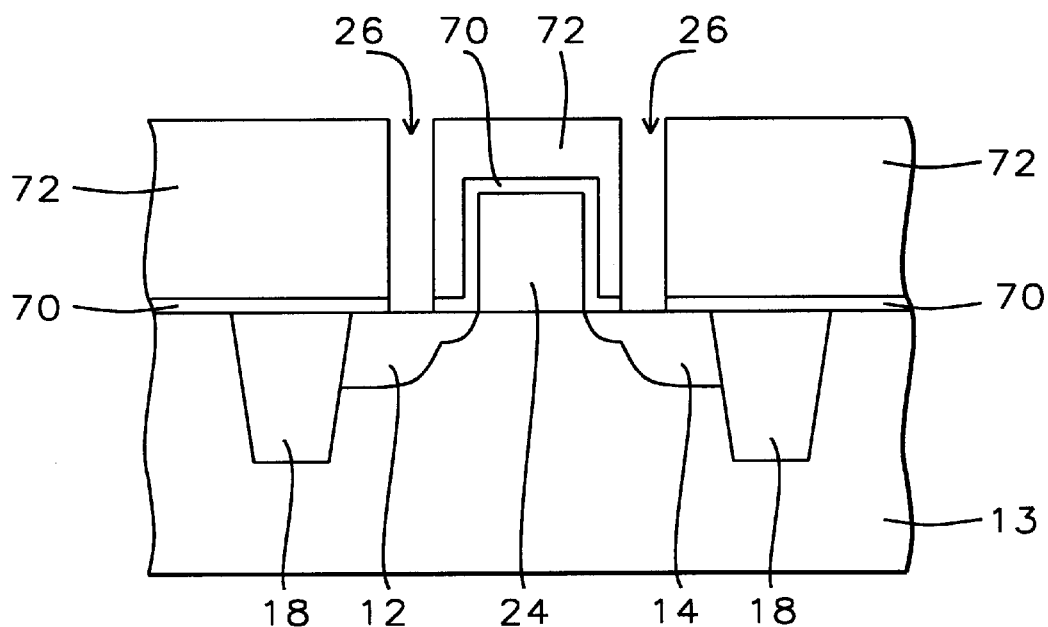
FIG. 1 – Prior Art
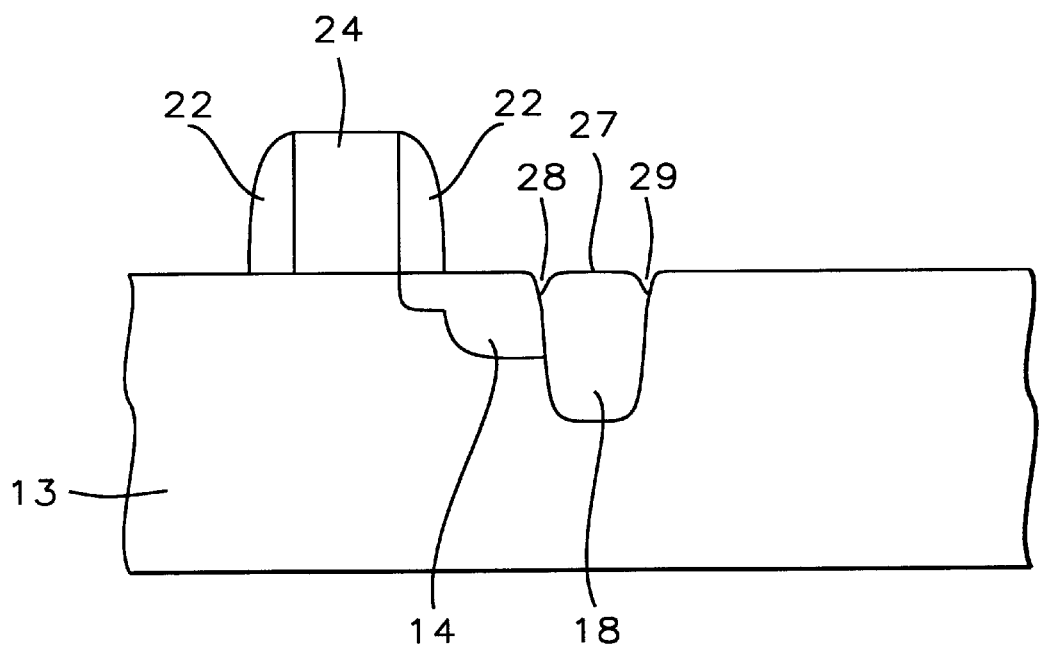
FIG. 2 – Prior Art

METHOD FOR FORMING A MOSFET WITH RAISED SOURCE AND DRAIN, SALICIDING, AND REMOVING UPPER PORTION OF GATE SPACERS IF BRIDGING OCCURS

BACKGROUND OF THE INVENTION (1) Field of the Invention

The invention relates to the field of semiconductor processing, and more specifically to the creation of source and drain regions formed in the salicide processes.

(2) Description of the Prior Art

As transistor dimensions have decreased, the conventional contact structures used began to limit device performance. It was, for instance, not possible to minimize the contact resistance if the contact hole was of minimum size while problems with cleaning small contact holes became a concern. In addition, the area of the source/drain regions could not be minimized because the contact hole had been aligned to this region using a separate masking step whereby extra area had to be allocated to accommodate misalignment. It was also practice to use several, small contact holes of identical size meaning that the full width of the source/drain region was not available for the contact structure. This resulted in the source/drain resistance being proportionally larger than it would have been in a device having minimum width.

Self-alignment is a technique in which multiple regions on the wafer are formed using a single mask, thereby eliminating the alignment tolerances that are required by additional masks. As circuit sizes decrease, this approach finds more application. One of the areas where the technique of self-alignment was used at a very early stage was the self-aligned source and gate implant to the poly gate.

One of the alternate structures that have been employed in an effort to alleviate the problem of increased source/drain resistance is the formation of self-aligned silicides on the source/drain regions. Where these silicides are formed at the same time as the polycide structure, this approach is referred to as a salicide process. The entire source/drain region (of, for instance, a MOSFET device) is contacted with a conductor film. This approach becomes even more attractive where such a film can be formed using a self-aligned process that does not entail any masking steps.

Continuous shrinkage of the gate length demands low resistivity of the source/drain regions, as well as shallow junctions in the source/drain areas to avoid short channel effect, which is mainly caused by inappropriate dopant distribution underneath the channel region. Shallow junctions greatly help resolve this problem.

Various techniques have been developed for forming the shallow source/drain junctions that are needed for sub-micron CMOS devices. One such approach uses As for the n-channel devices while $BF_2^+$ is used for the p-channel devices. Another approach applies the formation of $CoSi^2$ (before the formation of the source and the drain regions) by means of heavy ion implantation. Yet another approach uses the creation of so-called elevated source-drain. A thin (for instance 0.2 um.) epitaxial layer of silicon can be selectively deposited onto the exposed source/drain areas of the MOS transistor, this following the implantation of the lightly doped region of the LDD structure and the formation of the spacers. This process leads to the formation of heavily doped, shallow source/drain regions. The source/drain junction depths in this case are less than 0.2 um.

FIG. 1 shows Prior Art formation of a gate electrode with contact openings for the source/drain regions. A polysilicon gate structure 24 is formed including the formation of Shallow Trench Isolation (STI) regions 18 between the gate structures. After the source and drain areas 12 and 14 have been implanted to form the source/drain junctions, the sidewall spacers (not shown) are formed. Spacers can be made using silicon-nitride or silicon-oxide, BSG, PSG, polysilicon, other materials preferably of a dielectric nature, CVD oxide formed from a TEOS source. Often used are amorphous materials that inhibit the deposition of epitaxial silicon thereupon.

A silicon oxide spacer can be formed via anisotropic RIE of said silicon oxide layer, using industry standard gasses as etchants.

A silicon nitride spacer can be formed via anisotropic RIE of said silicon nitride layer, using industry standard gasses as etchants.

A thin layer 70 of undoped oxide is deposited over the gate electrode 24, the adjacent STI regions 18 and the exposed surface of the semiconductor substrate 13. Over this layer 70, a layer 72 of boronphosphosilicate glass (BPSG) needs to be added for conventional contacts. Contact holes 26 are opened in layer 72 and layer 70 down to the source/drain regions 12 and 14, these contact openings typically have a width of between 0.25 and 0.35 um.

FIG. 2 shows the effect that exposure to wet cleaning can have on the surface of the STI areas. Gate electrode 24 is shown together with gate spacers 22 and an adjacent STI region 18. The surface 27 of the STI 18 shows two irregularities in the areas 28 and 29 where this surface 27 interfaces with the surface of the semiconductor substrate 13. During the formation of the STI region, the silicon in the areas 28 and 29 can be exposed by wet cleaning. The exposed silicon can be salidicized at that time and can therefore cause leakage currents to occur.

The salicide process further has a limitation related to the fact that the gate and the source/drain silicides are formed at the same time. On the gate, it is desirable for the silicide to have the lowest possible sheet resistance (so the gate electrode will also have a low interconnect resistance). To achieve this, a thick silicide layer is needed. Over the source/drain regions, however, the silicide can only be of limited thickness in order to prevent excess consumption of the substrate silicon by silicide formation. Thus, a thicker silicide, though favorable at the gate level, is detrimental to contact formation. The present invention addresses this problem by teaching a process of forming raised areas out of the landing pads where contact is established with the source and the drain areas. These raised areas further alleviate the difficulties experienced during metalization to form shallow junctions. This latter problem is caused by junction leakage current that is observed when the silicidation process is used.

U.S. Pat. No. 5,691,212 (Tsia et al.) shows a salicide process that forms raised S/D regions using an amorphous Si deposition, a N2 I/I and oxidation.

U.S. Pat. No. 5,736,419 (Naem) and U.S. Pat. No. 5,780,349 (Naem) show processes for raised S/D regions using a poly layer and CMP to define the raised S/D.

U.S. Pat. No. 5,804,846 (Fuller) shows a self aligned raised S/D process.

U.S. Pat. No. 5,827,768 (Lin et al.) shows a self aligned raised S/D process using CMP.

SUMMARY OF THE INVENTION

A principle objective of the invention is to reduce excessive consumption of substrate silicon in the formation of salicide source/drain contact points.

Another objective of the present invention is to provide a method for the creation of raised source and drain areas for the salicide process.

Another objective of the present invention is to replace the method of selective epitaxial growth to raise source/drain contact points with a simplified method.

Another objective of the present invention is to provide an economical method for the growth of shallow salicide junctions.

Another objective of the invention is to replace the process of selective epitaxial source/drain junction growth with a process of deposition and etching of a poly silicon.

Another objective of the invention is to eliminate the adverse effect that silicon consumption has on the formation of shallow junctions.

A method is provided for the creation of raised landing pads for gate electrodes. A gate electrode with gate spacers and gate isolation areas is formed, the gate electrode contains two layers, a bottom layer of poly and a top layer of oxide or SOG. A dielectric layer of CVD oxide is deposited over the gate electrode, contact openings for the source/drain regions are created in this CVD oxide. A layer of polysilicon is deposited over the layer of CVD oxide and the contact openings. A pattern of photo resist is formed in the areas where the landing pads have to be created. The polysilicon is etched in accordance with the photo resist pattern thus creating the elevated landing pads. Source and drain areas of the gate electrode can be contacted by metallic contacts that are in contact with these landing pads. The top layer of the gate electrode is removed thereby making the electrode a recessed electrode (the tops of the gate spacers protrude above the top surface of the gate electrode). Salicidation is performed, the elevated tops of the spacers can be removed thereby breaking any electrical shorts that may have been established during the salicidation between the gate electrode and the landing pads.

BRIEF DESCRIPTION OF THE DRAWINGS

FIG. 1 shows a cross section of a Prior Art gate electrode with source/drain contact points.

FIG. 2 shows STI surface damage that can occur by wet cleaning during the formation of the STI regions.

DETAILED DESCRIPTION OF THE PREFERRED EMBODIMENT

Figure 3:
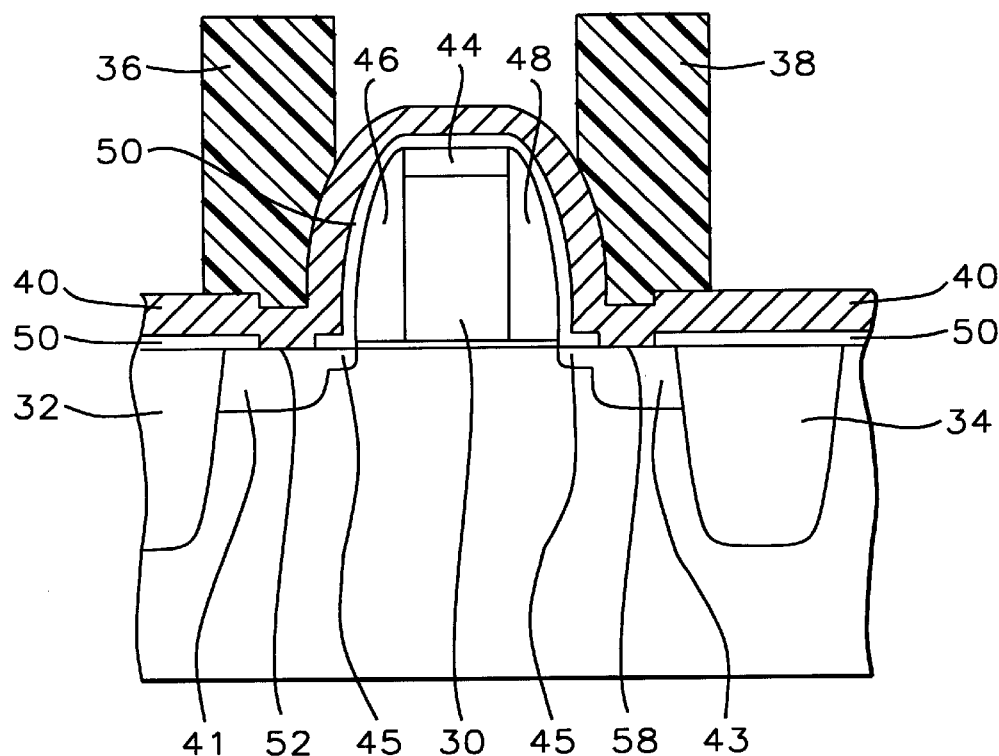
FIG. 3 shows a cross section of the gate electrode after the deposition and patterning of the landing pads within the source/drain areas.

Referring now specifically to FIG. 3, there is shown a cross section of the gate electrode after the deposition and patterning of the landing pads within the source/drain areas.

FIG. 3 shows the deposition and patterning of a layer of polysilicon, layer 40.

A polysilicon gate structure 30/44 is formed including the formation of Shallow Trench Isolation (STI) regions 32/34 adjacent to the gate structure and including the formation of sidewall spacers 46/48.

Figure 4:
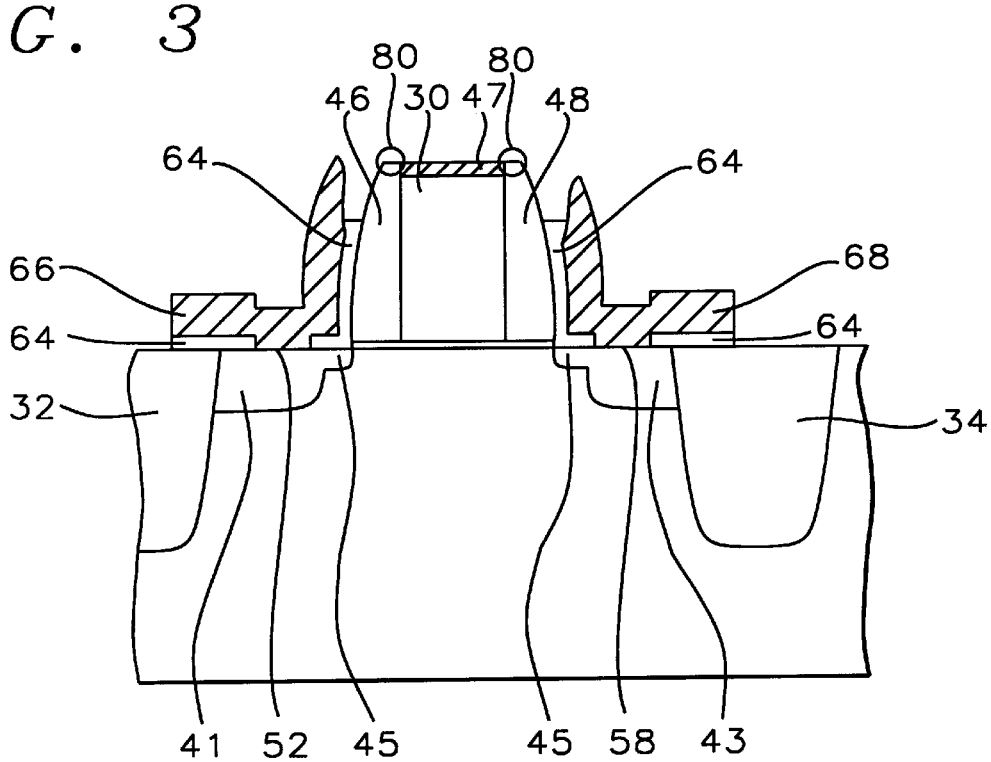
FIG. 4 shows a cross section of the gate electrode and the landing pads obtained after the deposited landing pads have been etched.

Layer 44 has been deposited on the top surface of the polysilicon gate structure 30/44. The composition of layer 44 can contain oxide or SOG (spin-on-glass) or nitride. The purpose of layer 44 is to eliminate bridging during later processing steps. The bridging can occur by forming a silicide interface between the landing pads (66 and 68, FIG. 4) and gate 30 (FIG. 4). Should this bridging occur then a (quick) CMP can be applied that selectively removes the tips 80 of spacers 46 and 48 (FIG. 4) thereby removing the bridge.

The source and drain areas are not highlighted in FIG. 3, these areas may be implanted if required. LDD areas for the source and drain regions can be formed immediately after the formation of the spacers by ion implantation for the $n^+$ and the $p^+$ contacts followed by annealing.

A dielectric layer 50 of CVD oxide is deposited over the gate structure 30/44 and the surface of the substrate surrounding the gate structure, including the STI 32/34 regions. Contact holes 52 and 58 are opened in layer 50 down to the source/drain areas.

Layer 50 also helps prevent the exposed silicon on the top corners of the STI structure from being salicided, thereby eliminating potential junction leakages between the source/drain regions and the lower wall areas of the STI. This phenomenon of leakage currents has previously been highlighted under FIG. 2.

The layer 40 of polysilicon is deposited over oxide layer 50 and over the source/drain contact openings 52 and 58. The deposited layer 40 of polysilicon typically has a thickness within the range between about 500 and 1500 Angstrom.

For the deposition of the poly layer 40 state of the art poly deposition processes can be used. In-situ doped poly may not be appropriate since both $n^+$ and $p^+$ contacts are present. Ion implants will be required to dope the two contacts; patterning will be required for these implants resulting in a total of two ion implant layers.

Photo resist is deposited and etched to form the photoresist masks 36 and 38 which are used to define the poly landing pads.

FIG. 4 shows the formation of the salicide landing pads 66 and 68. A poly etch of layer 40 (FIG. 3) is performed to form the poly landing pads 66 and 68. The poly etch removes the polysilicon layer 40 where this layer is exposed, that is where layer 40 is not covered by the deposited photoresist masks 36 and 38 (FIG. 3). The parts of the polysilicon layer that remain in place form the landing pads 66 and 68.

The poly etch of layer 40 exposes the dielectric layer 50 of CVD oxide where this layer 50 was under the removed poly of layer 40. The exposed area of this dielectric layer 50 is removed by conventional dry oxide etch, this removal exposes layer 44 (FIG. 3). Layer 44 is in turn removed, selective to the spacers. The latter removal of layer 44 makes the gate electrode 30 a recessed area that is ready for further salicidation process. To be noted in FIG. 4 are the top areas 80 of the spacers 46/48, these areas extend above the top surface of the gate electrode 30. The layers 64 are the remains of layer 50 (FIG. 3) that are not removed by etching.

The salicidation is performed, as is known in the art, by depositing a reactive material, such as titanium, over all exposed surfaces of FIG. 4 and then annealing these surfaces so that the polysilicon landing pads 66/68 and the surface of poly gate 30 and the reactive metal react to form a metal salicide (such as titanium salicide). If bridging from the silicided gate 30 to the silicided landing pads 66 and 68 occurs, a key point of the invention is that the bridging may be easily removed by a brief mechanical polishing such as by Chemical Mechanical Polishing (CMP). The uppermost tips 80 of spacers 46/48 are removed without affecting the silicided top surface of the gate 30, which is recessed due to the formation and removal of layer 44.

The formation of landing pads 66 and 68 as shown makes it clear that the source and drain areas are effectively raised (by the landing pads).

It must be pointed out that the raised landing pads 66/68 can readily serve as landing pads for metal contacts. For the application of metal contacts, the metal contact design rules and limitations can be relaxed by using the raised landing pads 66/68. The formation of shallow junctions is thereby made feasible without incurring the Prior Art consumption of single crystal silicon. It must further be pointed out that the traditional technique of achieving raised source and drain region by means of selective epitaxial growth has, by the formation of layers 66 and 68, been greatly simplified.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of fabricating raised salicide landing pads within a semiconductor substrate surface containing a salicide gate structure comprising gate spacers, said method comprising:

providing a semiconductor substrate;

depositing a layer of polysilicon over said gate structure;

patterning landing pads within said layer of polysilicon;

etching landing pads in said layer of polysilicon;

siliciding said landing pads; and removing an upper portion of said gate spacers if bridging occurs, during silicidation, between said gate structure and said poly landing pads.

2. The method of claim 1 wherein said salicide gate structure comprises:

a gate electrode with gate spacers;

gate isolation areas;

a thin layer of CVD oxide over the surface of said gate electrode thereby including said gate spacers thereby further including said gate isolation areas and the surface of said substrate in the vicinity of said gate electrode; and contact points through said thin layer of oxide said contact points being aligned with and serving as contact points for the source and drain regions of said gate electrode.

3. The method of claim 2 whereby said gate electrode comprises a bottom layer of polysilicon and a top layer of oxide.

4. The method of claim 2 whereby said gate electrode comprises a bottom layer of polysilicon and a top layer of SOG.

5. The method of claim 2 whereby said gate electrode comprises a bottom layer of polysilicon and a top layer of nitride.

6. The method of claim 2 whereby said thin layer of CVD oxide has a thickness between 250 and 500 Angstrom.

7. The method of claim 1 further comprising the step of performing polysilicon ion implantation within the $n^+$ or $p^+$ regions of said gate electrode, wherein said implantation is performed after said step of depositing said layer of polysilicon.

8. The method of claim 7 further comprising the step of annealing said ion implantation regions.

9. The method of claim 1 wherein said landing pads are overlaying and meet said contact points for the source and drain regions of said gate electrode.

10. The method of claim 1 wherein said etching landing pads comprises:

removing said polysilicon layer where this layer is not covered by said patterned landing pads;

removing that portion of said thin layer of oxide that is not covered by said patterned landing pads;

removing said top layer of said gate electrode thereby forming a recessed gate electrode selective to the gate spacers; and removing said patterned landing pads photo resist thereby creating elevated poly landing pads for the source and drain regions of said gate electrode.

11. A method of fabricating raised salicide landing pads comprising the steps of:

providing a semiconductor substrate; creating a gate electrode on the surface of said semiconductor substrates said gate electrode to comprise gate spacers and adjacent gate shallow trench isolation areas, said gate electrode further to comprise a top and a bottom layer whereby sides of both top and bottom layer are covered by said gate spacers;

overlaying said gate electrode with a thin layer of oxide thereby including the surface of said semiconductor substrate adjacent to said gate electrode and extending beyond said STI areas;

forming contact openings in said thin layer of oxide; depositing a layer of polysilicon over said thin layer of oxide and over said contact openings;

patterning said polysilicon to form polysilicon landing pads over source and drain areas in said substrate;

removing said thin layer of oxide where this thin layer of oxide is not covered by said landing pads;

removing said top layer of said gate electrode thereby forming a recessed gate electrode selective to the gate spacers thereby furthermore extending top portions of said spacers above the top surface of the gate polysilicon;

siliciding said gate polysilicon and said polysilicon landing pads; and mechanically removing an upper portion of said spacers if bridging occurs, during silicidation, between said gate and said poly landing pads.

12. The method of claim 13 whereby said contact openings are patterned and etched through said thin layer of oxide said contact openings being aligned with and serving as contact openings for the source and drain regions of said gate electrode.

13. The method of claim 11 whereby said gate electrode comprises a bottom layer containing polysilicon and a top layer containing oxide.

14. The method of claim 11 whereby said gate electrode comprises a bottom layer containing polysilicon and a top layer containing SOG.

15. The method of claim 11 whereby said gate electrode comprises a bottom layer containing polysilicon and a top layer containing nitride.

16. The method of claim 11 whereby said thin layer of oxide comprises a layer of oxide with a thickness within the range of between 250 and 500 Angstrom.

17. The method of claim 11 furthermore including the step of performing polysilicon ion implantation within the $n^+$ or p⁺ regions of said gate electrode said implantation to be performed after the said step of depositing said layer of polysilicon.

18. The method of claim 17 further comprising the step of annealing said ion implantation regions.

19. The method of claim 11 wherein said landing pads are overlaying and meet said contact openings for said source and drain regions of said gate electrode.

20. The method of clam 11 wherein said patterning said polysilicon to form polysilicon landing pads comprises forming a pattern whereby said pattern mates with said source and drain contact openings.

21. The method of claim 11 whereby patterning said polysilicon to form polysilicon landing pads is depositing a layer of photoresist further etching said layer of photoresist in accordance with said pattern for said landing pads whereby said landing pads mate with said contact openings.

* * * * *